(12) United States Patent
Nagai et al.

(10) Patent No.: US 7,183,581 B2
(45) Date of Patent: Feb. 27, 2007

(54) OPTICAL TRANSMISSION MODULE FOR USE IN HIGH-SPEED OPTICAL FIBER COMMUNICATION

(75) Inventors: Shuichi Nagai, Kyoto (JP); Hiroyuki Sakai, Kyoto (JP); Kazuhiro Yahata, Suita (JP); Seiichiro Tamai, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/019,114

(22) Filed: Dec. 22, 2004

(65) Prior Publication Data

US 2005/0189548 A1    Sep. 1, 2005

(30) Foreign Application Priority Data

Dec. 25, 2003  (JP) .............................. 2003-431056

(51) Int. Cl.
*H01L 33/00* (2006.01)
(52) U.S. Cl. ............................ 257/82; 257/80; 257/84; 385/88; 385/14; 385/49; 385/94; 385/92
(58) Field of Classification Search ................ 385/88, 385/14, 49, 94, 92; 257/80, 82, 84
See application file for complete search history.

(56) References Cited

U.S. PATENT DOCUMENTS

2004/0101260 A1* 5/2004 Sato ............................ 385/94

FOREIGN PATENT DOCUMENTS

JP    2002-151782    5/2002

* cited by examiner

*Primary Examiner*—Evan Pert
*Assistant Examiner*—Tan Tran
(74) *Attorney, Agent, or Firm*—McDermott Will & Emery LLP

(57) ABSTRACT

An optical transmission module that can be produced more easily and uses a shorter wiring pattern connecting the driving device and the light-emitting device than the conventional light-emitting apparatus, with the driving device and the light-emitting device arranged close to each other. The light-emitting device and the light-receiving device for monitoring the backward light emitted from the light-emitting device are arranged on a main surface of the substrate. The driving device is disposed on a bottom of a concave formed between the light-emitting device and the light-receiving device so that the driving device is lower than a straight line connecting a backward light emitting point of the light-emitting device and a backward light receiving point of the light-receiving device.

6 Claims, 14 Drawing Sheets

PRIOR ART

PRIOR ART

OPTICAL TRANSMISSION MODULE FOR USE IN HIGH-SPEED OPTICAL FIBER COMMUNICATION

BACKGROUND OF THE INVENTION (1) Field of the Invention

The present invention relates to an optical transmission module used in a high-speed optical fiber communication, and specifically relates to a low-cost optical transmission module.

(2) Description of the Related Art

A general optical transmission module includes a light-emitting device, a light-receiving device, and a driving device that are arranged on a substrate. The light-receiving device monitors light emitted backward from the light-emitting device. The driving device drives the light-emitting device. On the substrate, wiring patterns for electrically connecting the devices are formed.

Meanwhile, a high-frequency electric current is applied to drive the light-emitting device at high speeds, and the high-frequency electric current flows through the wiring pattern connecting the driving device and the light-emitting device. For this reason, when an optical transmission module is designed, it is necessary to take into consideration the parasitic inductance and the parasitic capacitance that affect the high-frequency electric current.

Japanese Laid-Open Patent Application No. 2002-151782 discloses a light-emitting apparatus that includes a light-emitting device, a driving device, and a light-receiving device that are arranged in the stated order on a substrate. In the conventional light-emitting apparatus with this construction, the backward light emitted from the light-emitting device is guided so as to bypass the driving device and pass through an optical guide groove, which is formed in the substrate, to reach the light-receiving device. With such a construction, it is possible to arrange the light-emitting device and the driving device close to each other. This enables the wiring pattern connecting these devices to be reduced in length. This means that the parasitic inductance and the parasitic capacitance generated in this wiring pattern are reduced.

FIG. 14 is a plane view of the light-emitting apparatus disclosed in Japanese Laid-Open Patent Application No. 2002-151782. FIG. 15 is a cross section of the light-emitting apparatus.

A light-emitting apparatus 2000 includes LD (Laser Diode) 2002, IC (Integrated Circuit) 2003, and PD (Photo-Diode) 2004 that are arranged in the stated order on a substrate 2010, where the LD 2002 is a light-emitting device, the IC 2003 is a driving device, and the PD 2004 is a monitoring light-receiving device.

An optical guide groove 2005 is formed on the substrate 2010 so that light 2006 emitted from the LD 2002 bypasses the IC 2003 and reaches a light-receiving unit 2007 of the PD 2004.

However, to manufacture the light-emitting apparatus 2000, it is required to adjust the positions of the LD 2002 and the PD 2004 accurately, so that the light 2006 emitted from the LD 2002 is received by the light-receiving unit 2007 of the PD 2004 via the optical guide groove 2005. Also, it is required to form the optical guide groove 2005 accurately. These are problematic factors in terms of the mass productivity or the production cost.

SUMMARY OF THE INVENTION

The object of the present invention is therefore to provide an optical transmission module that can be produced more easily and uses a shorter wiring pattern connecting the driving device and the light-emitting device than the conventional light-emitting apparatus disclosed in the above-mentioned patent document, with the driving device and the light-emitting device arranged close to each other.

The above object is fulfilled by an optical transmission module comprising: a light-emitting device; a light-receiving device operable to monitor backward light emitted from the light-emitting device; a driving device operable to drive the light-emitting device; and a substrate on which the light-emitting device, the light-receiving devices and the driving device are arranged, wherein the driving device is disposed between the light-emitting device and the light-receiving device so as to be lower than a straight line connecting a backward light emitting point of the light-emitting device and a backward light receiving point of the light-receiving device.

With the above-stated construction in which the driving device and the light-emitting device are arranged close to each other, and the backward light emitted from the light-emitting device travels over the head of the driving device, it is possible to shorten the wiring pattern connecting the light-emitting device with the driving device. Also, the optical transmission module of the present invention requires neither an accurate adjustment of the position of each device nor accurate formation of the optical guide groove, while the light-emitting apparatus disclosed in the above-mentioned patent document does. This enables the optical transmission module of the present invention to be produced at low cost.

In the above-described optical transmission module, a concave may be formed on a surface of the substrate between the light-emitting device and the light-receiving device, and the driving device may be disposed on a bottom of the concave.

Also, in the above-described optical transmission module, a front convex may be formed on a surface of the substrate in front of the driving device, a back convex may be formed on a surface of the substrate in back of the driving device, the light-emitting device may be disposed on top of the front convex, and the light-receiving device may be disposed on top of the back convex.

With the above-stated construction in which the driving device is disposed to be lower than the light-emitting device and the light-receiving device, it is possible to prevent the driving device from blocking the backward light emitted from the light-emitting device.

In the above-described optical transmission module, a depth of the concave may be approximately equal to a height of the driving device disposed on the bottom of the concave, a wiring pattern is formed on the substrate to electrically connect the light-emitting device with the light-receiving device, and the wiring pattern is connected with the driving device by a conducting wire.

With the above-stated construction, shorter wires than conventional ones can be used to connect the driving device, on top of which an electrode is disposed, with a wiring pattern formed on the substrate.

In the above-described optical transmission module, the conducting wire may be a ribbon wire.

With the above-stated construction, it is possible to achieve a connection with excellent high-frequency property.

In the above-described optical transmission module, a concave may be formed on a surface of the substrate on a side of the backward light emitting point of the light-emitting device, and the driving device and the light-receiving device are disposed on a bottom of the concave.

With the above-stated construction, the height of the light-receiving surface of the light-receiving device can be adjusted by the depth of the concave, in accordance with the height of the path of the backward light emitted from the light-emitting device.

In the above-described optical transmission module, a groove may be formed in the driving device so as to let the backward light pass through a space thereof.

With the above-stated construction, it is possible to arrange the driving device and the light-emitting device close to each other while preventing the driving device from blocking the backward light emitted from the light-emitting device.

The above object is also fulfilled by an optical transmission module comprising: a light-emitting device; a driving device operable to drive the light-emitting device; a first substrate on which the light-emitting device and the driving device are arranged; a light-receiving device operable to monitor backward light emitted from the light-emitting device; and a second substrate on which the light-receiving device is arranged, wherein a concave is formed on a surface of the first substrate on a side of the backward light emitting point of the light-emitting device, and the driving device is disposed on a bottom of the concave, and the concave is covered with the second substrate.

The above object is also fulfilled by an optical transmission module comprising: a light-emitting device; a driving device operable to drive the light-emitting device; a substrate on which the light-emitting device and the driving device are arranged; and a light-receiving device operable to monitor backward light emitted from the light-emitting device, wherein a concave is formed on a surface of the substrate on a side of the backward light emitting point of the light-emitting device, the driving device is disposed on a bottom of the concave, and the light-receiving device is disposed on top of the driving device.

With the above-stated construction, it is possible to arrange the light-emitting device and the driving device closer to each other than conventional ones. This enables a shorter wiring pattern than conventional ones to be used to connect the light-emitting device with the driving device. Also, due to the disposition of the light-receiving device on top of the driving device, it is possible to arrange the light-emitting device and the driving device closer to each other, and the light-receiving device can receive, from the light-emitting device, enough amount of light to measure the received light. Furthermore, the present invention enables a smaller optical transmission module than conventional ones to be produced

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT

The following describes preferred embodiments of the present invention with reference to the attached drawings.

<Embodiment 1>

Figure 1:
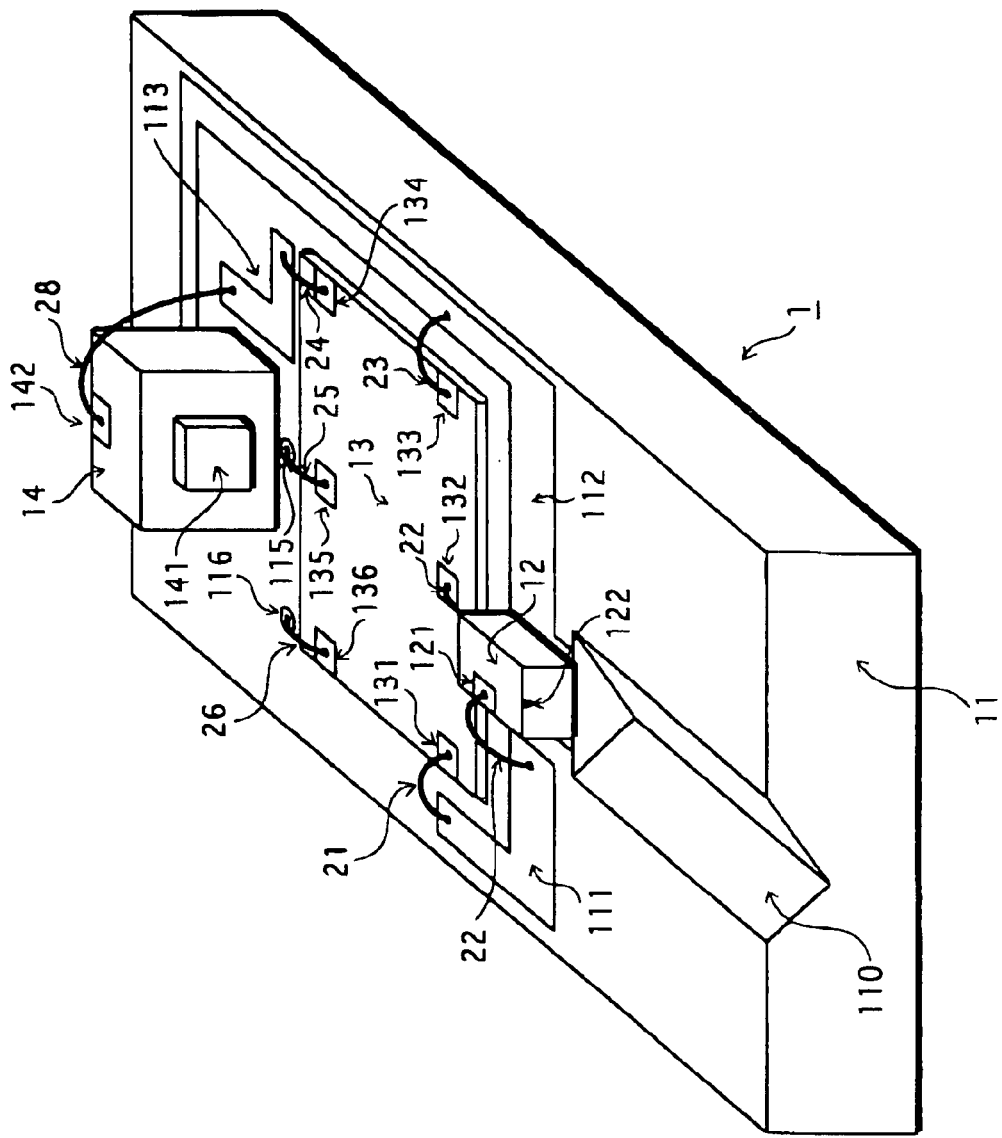
FIG. 1 is a perspective view of the optical transmission module in Embodiment 1.
Figure 2:
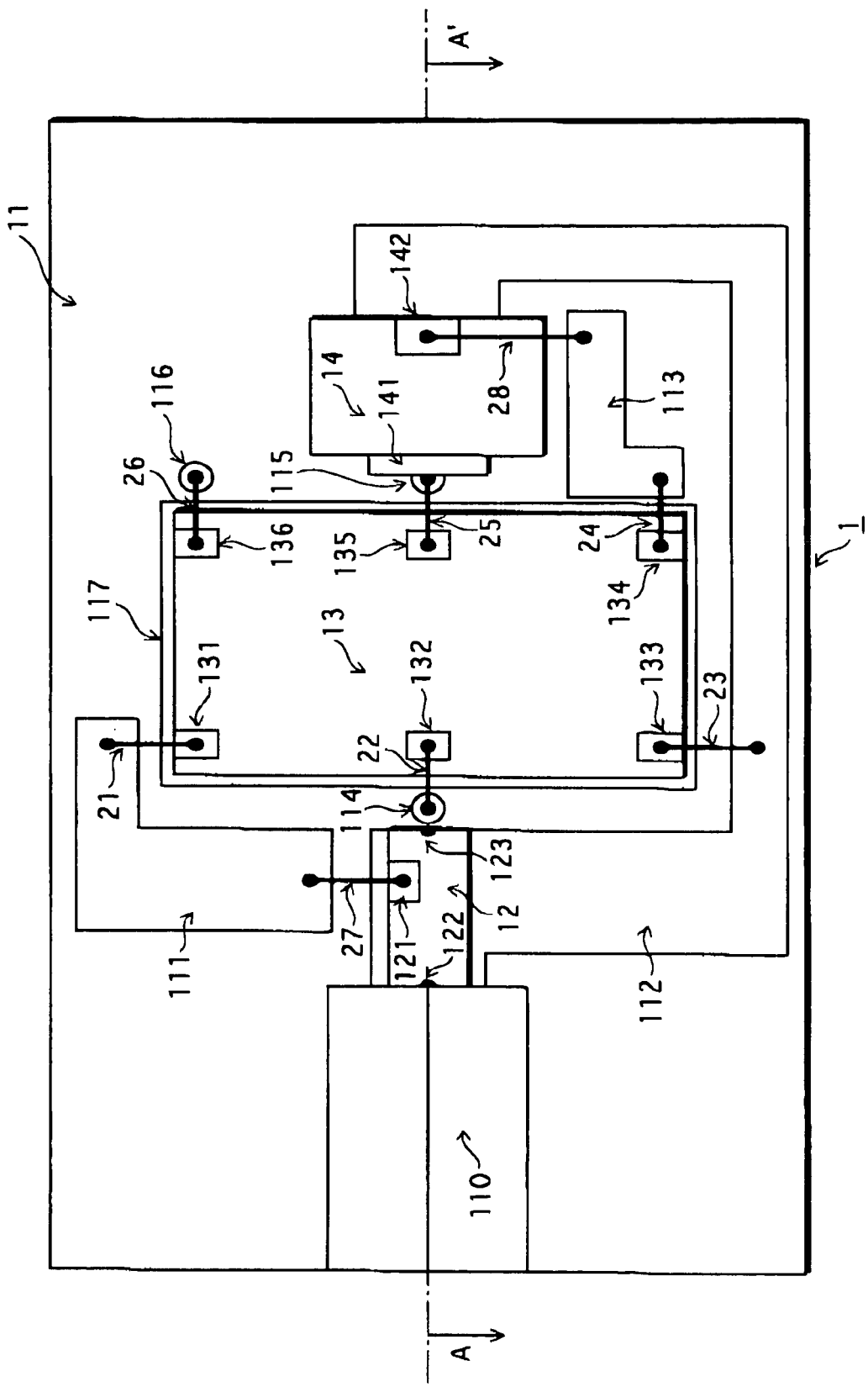
FIG. 2 is a plane view of the optical transmission module in Embodiment 1.
Figure 3:
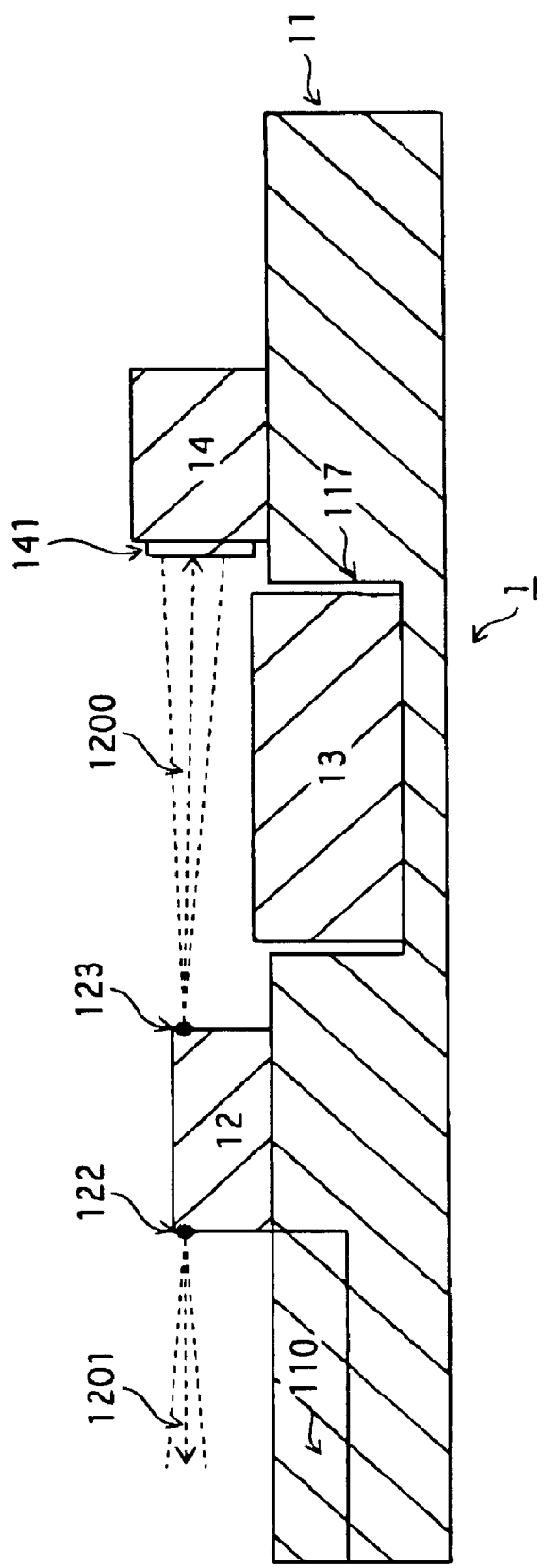
FIG. 3 is a cross section of the optical transmission module in Embodiment 1.

FIG. 1 is a perspective view of the optical transmission module in Embodiment 1. FIG. 2 is a plane view of the optical transmission module shown in FIG. 1. FIG. 3 is a cross section taken substantially along line A–A' shown in FIG. 2.

An optical transmission module 1 includes a substrate 11, a light-emitting device 12, a driving device 13, a monitoring light-receiving device 14, and wires 21–28.

As shown in FIG. 1, the light-emitting device 12, driving device 13, and monitoring light-receiving device 14 are arranged in the stated order on the substrate 11 in line from before backward.

Each device arranged on the substrate 11 is minute, with each side being approximately 200–400 micron long.

The substrate 11 is a Si substrate, and in which a V groove 110, wiring patterns 111–113, vias 114–116, and a concave 117 are formed.

The V groove 110 is a groove cut in the shape of letter "V", to hold therein an optical fiber with an external diameter of 125 micron. To form the V groove 110, a mask alignment apparatus (not illustrated) or an etching apparatus (not illustrated) is usually used. Due to the characteristics of the crystalline structure of the semiconductor substrate, the angle of the etching groove is determined uniquely in correspondence with the width of the groove. As a result, the depth of the V groove 110 can be adjusted by its width.

The concave 117 is a concave formed in the shape of a rectangle to hold the driving device 13 on the bottom thereof. The size of the concave 117 depends on the size of the driving device 13.

The light-emitting device 12 is a semiconductor laser that emits light from its end faces, and includes a forward emitting point 122, a backward emitting point 123, a power electrode 121, and a ground electrode (not illustrated).

The light-emitting device 12 has a laminated structure. On its front surface, the power electrode 121 is formed, and on its back surface, the ground electrode is formed, and a light emitting layer (active layer) that includes the forward emitting point 122 and the backward emitting point 123 is formed on the side of the power electrode 121.

The light-emitting device 12 is mounted on the substrate 11 with the-power-electrode-121-side up by what is called junction-up method by connecting the ground electrode with the wiring pattern 112 by soldering.

The power electrode 121 is connected with the wiring pattern 111 by the wire 22.

The light-emitting device 12 emits light from the forward emitting point 122 and from the backward emitting point 123, where the amount of the emitted light depends on the high-frequency electric current received from the driving device 13. The light emitted from the forward emitting point 122 enters an end face of the optical fiber (not illustrated) that is disposed in the substrate 110. The light emitted from the backward emitting point 123 travels over the head of the driving device 13 disposed in the concave 117, and enters a light receiving unit 141 that is disposed on a side surface of the monitoring light-receiving device 14 located in back of the driving device 13.

FIG. 3 shows a backward light axis 1200 and a forward light axis 1201.

The driving device 13 is an IC chip for driving the light-emitting device 12 by sending the high-frequency electric current to the light-emitting device 12. The driving device 13 has the APC (Automatic Power Control) function for adjusting the amount of the current to be sent to the light-emitting device 12 in accordance with the output strength of the light emitted backward from the light-emitting device 12 so that the optical output of the light-emitting device 12 can be kept constant, the output strength being detected by the monitoring light-receiving device 14.

The driving device 13 has six terminals on top thereof.

A terminal 131 is connected with the wiring pattern 111 by the wire 21, and is used to supply the high-frequency electric current to the light-emitting device 12.

A terminal 132 is a power input terminal, and is connected with the via 114 by the wire 22.

A terminal 133 is a ground terminal, and is connected with the wiring pattern 112 by the wire 23.

A terminal 134 receives an activation current, which is generated when light is received, from the monitoring light-receiving device 14. The terminal 134 is connected with the wiring pattern 113 by the wire 29.

A terminal 135 is a control signal input terminal, and is connected with the via 115 by the wire 25.

A terminal 136 is a control signal output terminal, and is connected with the via 116 by the wire 26.

Disposing the driving device 13 on the bottom of the concave 117 provides an advantageous effect that the driving device 13 is prevented from blocking the backward light axis 1200, and an advantageous effect that shorter wires than before can be used to connect the terminals of the driving device 13 with the wiring patterns or vias in the substrate 11.

These advantageous effects will be described with reference to FIGS. 4 and 5.

Figure 4:
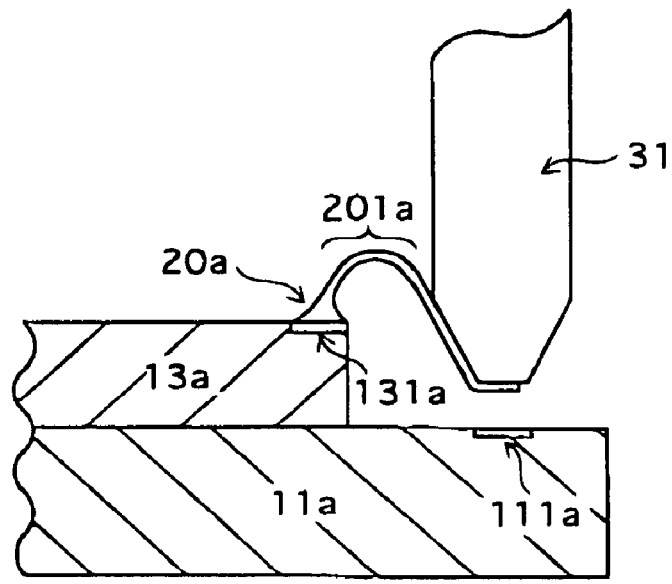
FIG. 4 shows wirebonding.

FIG. 4 shows how a terminal 131a of a chip 13a disposed on a substrate 11a is wirebonded with an electrode pad 111a on the substrate 11a.

For the wirebonding, a wirebonding-only tool called capillary, whose edge is conical in shape, is used. As the material of the wires, Au (gold) is mainly used.

As shown in FIG. 4, the terminal 131a is spaced enough from the electrode pad 111a to prevent a curve 201a of a wire 20a from having a steep angle, and to prevent a capillary 31 from coming into contact with the chip 13a.

If the curve 201a has a steeper angle, the possibility of the wire 20a being cut becomes higher. Also, there is a fear that if the capillary 31 comes into contact with the chip 13a, the chip 13a may be destroyed.

Figure 5:
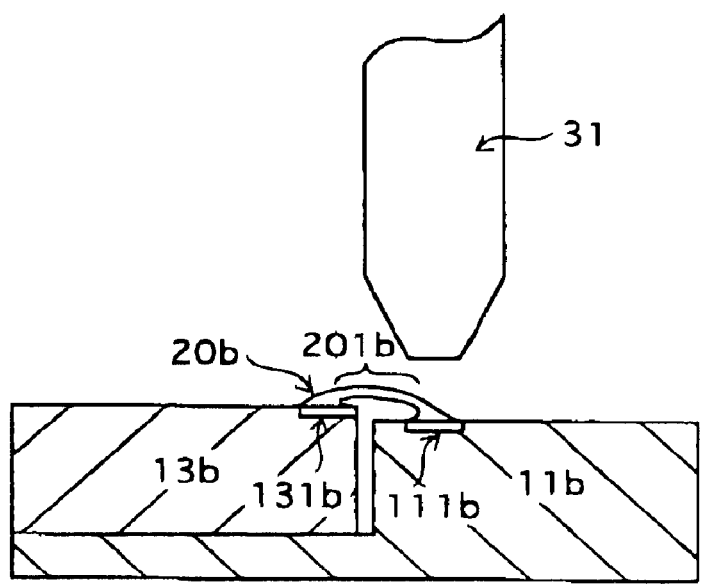
FIG. 5 shows wirebonding.

FIG. 5 shows how a terminal 131b of a chip 13b disposed in the concave of a substrate 11b is wirebonded with an electrode pad 111b on the substrate 11b.

As shown in FIG. 5, there is only a small vertical interval between the terminal 131b and the electrode pad 110b, and therefore the curve of a wire 20b has a moderate angle. Also, the capillary 31 is not in contact with the chip 13b. This means that the wire 20b can be shortened, and that the substrate can be reduced in area.

The monitoring light-receiving device 14 is a photodiode that includes the light receiving unit 141 on the front surface thereof, an electrode 142 on the top, and a ground electrode (not illustrated) on the bottom.

The electrode 142 is connected with the wiring pattern 113 by the wire 28.

The ground electrode of the monitoring light-receiving device 14 is connected with the wiring pattern 114 by soldering.

In the above-described optical transmission module 1, the light-emitting device and the driving device arranged close to each other. This enables the wiring pattern 111 to be shortened, and enables the parasitic inductance and the parasitic capacitance generated in the wiring pattern 111 to be reduced. Also, with the driving device 13 being disposed on the bottom of the concave 117 of the substrate 11, the driving device 13 is prevented from blocking the backward light that is emitted from the backward emitting point 123 of the light-emitting device 12.

The optical transmission module 1 requires neither an accurate positional adjustment of the light-emitting device and the light-receiving device nor presence of an optical guide groove, which are required by the conventional light-emitting apparatus disclosed in the above-mentioned patent document. Such construction of the present embodiment enables the optical transmission module to produced easily at low cost.

<Embodiment 2>

In the case where weak light is emitted backward from the light-emitting device, it may be necessary to arrange the monitoring light-receiving device and the light-emitting device close to each other.

The following describes the optical transmission module in Embodiment 2 in which the monitoring light-receiving device and the light-emitting device are disposed close to each other, and a short wiring pattern is used to connect the light-emitting device with the driving device.

Figure 6:
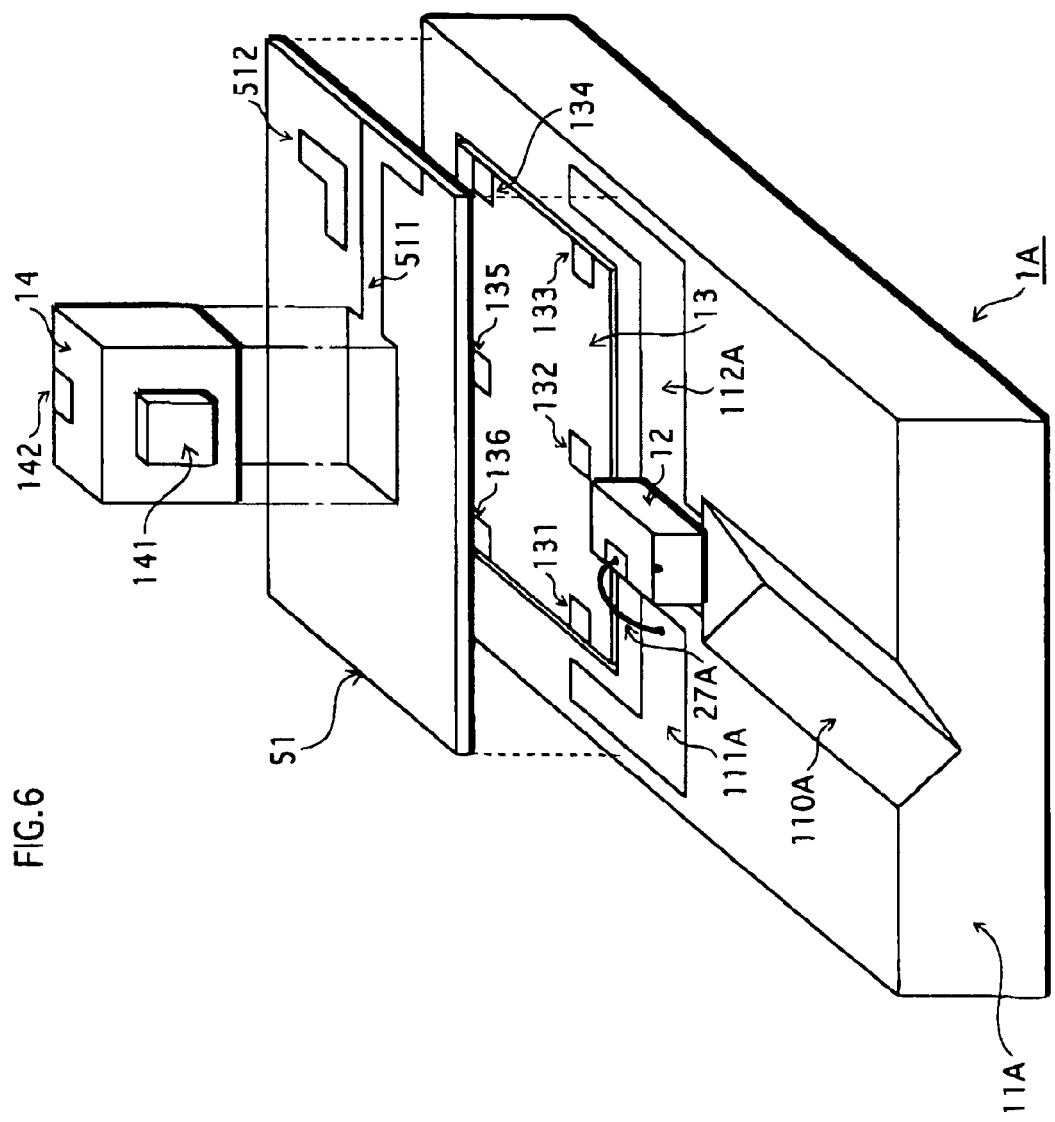
FIG. 6 is an exploded perspective view of the optical transmission module in Embodiment 2.
Figure 7:
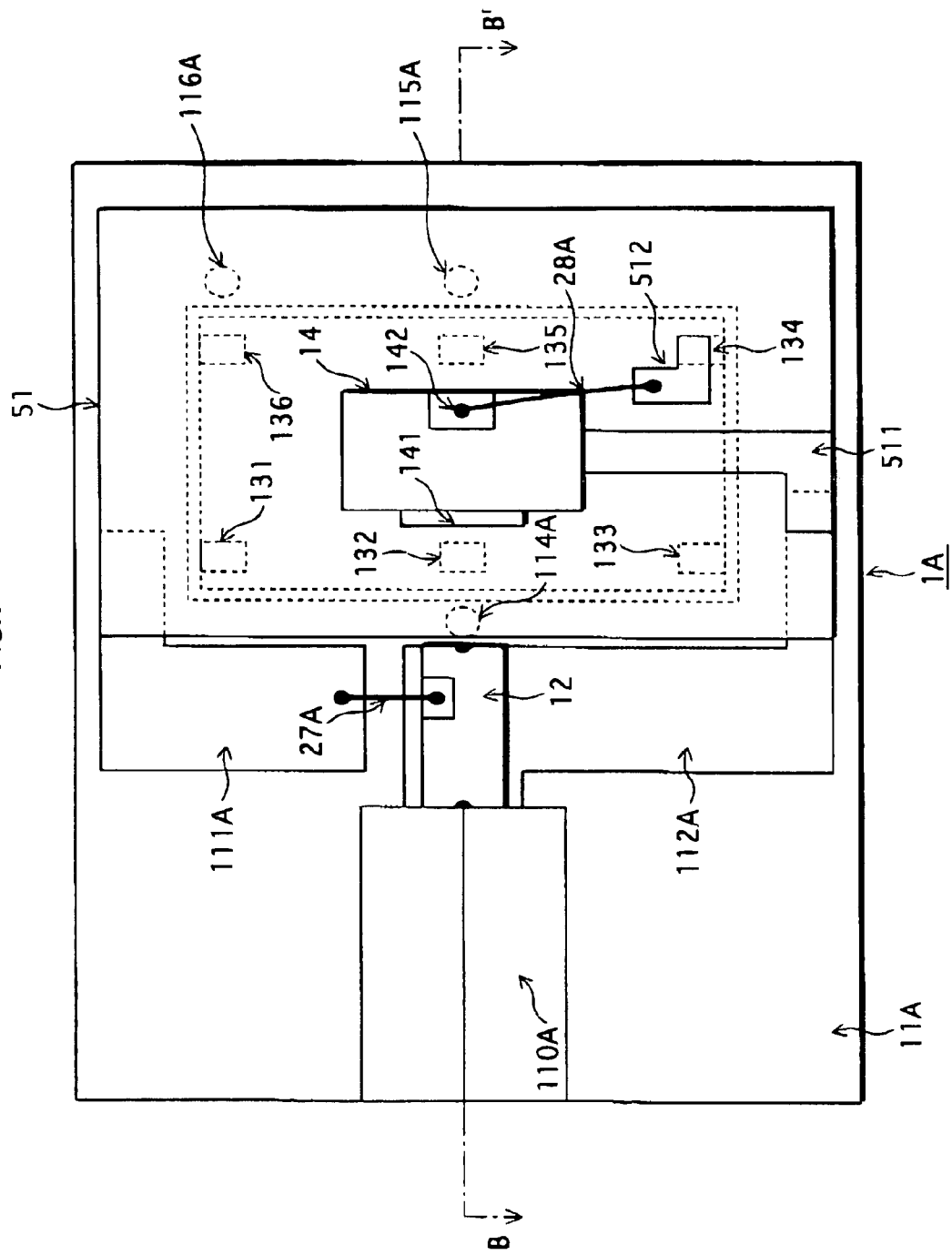
FIG. 7 is a plane view of the optical transmission module in Embodiment 2.
Figure 9:
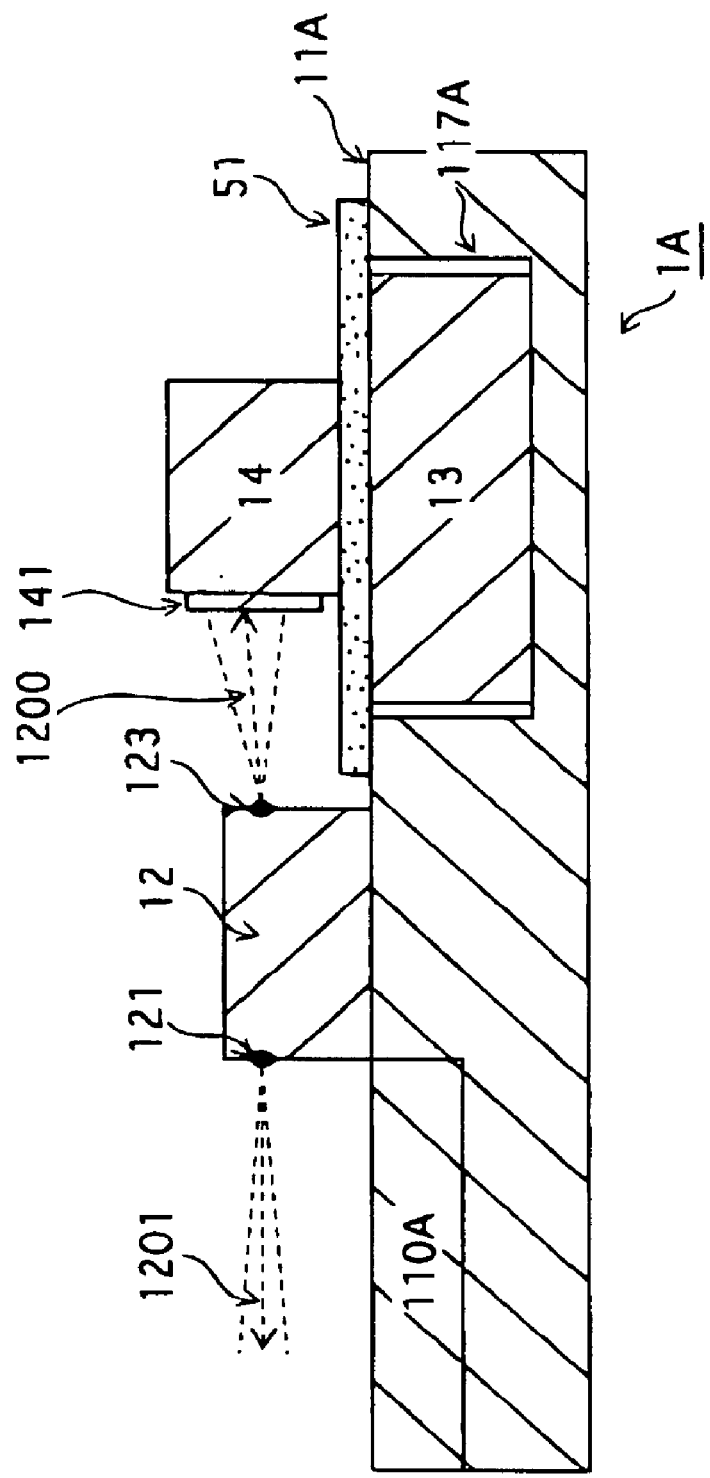
FIG. 9 is a cross section of the optical transmission module in Embodiment 2.

FIG. 6 is an exploded perspective view of the optical transmission module in Embodiment 2 FIG. 7 is a plane view of the optical transmission module shown in FIG. 6. FIG. 9 is a cross section taken substantially along line B–B' shown in FIG. 7.

An optical transmission module 1A includes a substrate 11A, the light-emitting device 12, the driving device 13, the monitoring light-receiving device 14, a sub-substrate 51, and wires 27A and 28A.

The optical transmission module 1A differs from the optical transmission module 1 in Embodiment 1 in that it uses the substrate 11A, which is shorter than the substrate 11 in the direction of length, and the sub-substrate 51.

The substrate 11A is a Si substrate, and in which a V groove 110A, wiring patterns 111A and 112A, vias 114A–116A, and a concave 117A are formed.

The substrate 11A is shorter than the substrate 11 because the driving device 13, which is arranged in front of the monitoring light-receiving device 14 on the substrate in Embodiment 1, is arranged under the sub-substrate 51 in Embodiment 2.

After the driving device 13 is disposed on the bottom of the concave 117, the sub-substrate 51 is disposed on the substrate 11A to cover the concave 117.

Figure 8:
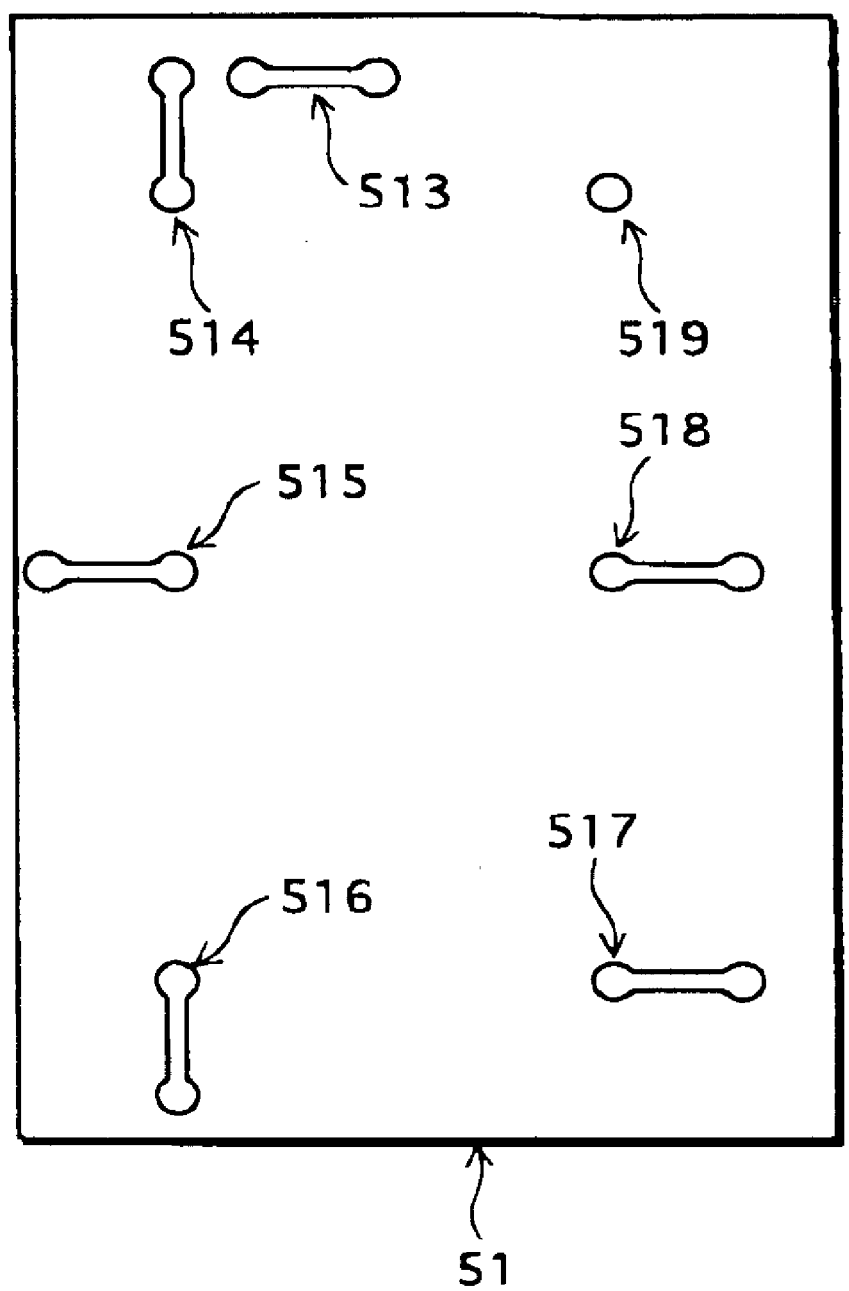
FIG. 8 is a plane view of the back surface of the sub-substrate 51.

FIG. 8 is a plane view of the back surface of the sub-substrate 51.

Wiring patterns 511 and 512 are formed on the front surface of the sub-substrate 51.

Wiring patterns 514–518 and vias 513 and 519 are formed on the back surface of the sub-substrate 51. The vias 513 and 519 are connected with the wiring patterns 511 and 512 formed on the front surface, respectively.

The wiring pattern 511 is connected with the ground terminal of the monitoring light-receiving device 14 by soldering, and is connected, via the via 513, with the wiring pattern 512 formed on the front surface by soldering.

The wiring pattern 512 is connected with the electrode 142 by wire, and is connected, via the via 519, with the terminal 134 by soldering.

The wiring pattern 514 is connected with the terminal 133 and the wiring pattern 112A by soldering.

The wiring pattern 514 is connected with the terminal 132 and the via 114A by soldering.

The wiring pattern 516 is connected with the terminal 131 and the wiring pattern 111A by soldering.

The wiring pattern 517 is connected with the terminal 136 and the via 116A by soldering.

The wiring pattern 518 is connected with the terminal 135 and the via 115A by soldering.

The optical transmission module 1A of Embodiment 2, in which the monitoring light-receiving device 14 is disposed immediately in back of the light-emitting device 12, can fully receive the backward light to monitor. Also, the optical transmission module 1A is smaller in size than the optical transmission module 1.

By using the sub-substrate 51, it is possible to reduce the number of wires being inferior in high-frequency property.

<Modifications>

The present invention is not limited to the optical transmission modules disclosed in embodiments 1 and 2, but includes the following modifications of the optical transmission module.

<Modification 1>

Figure 10:
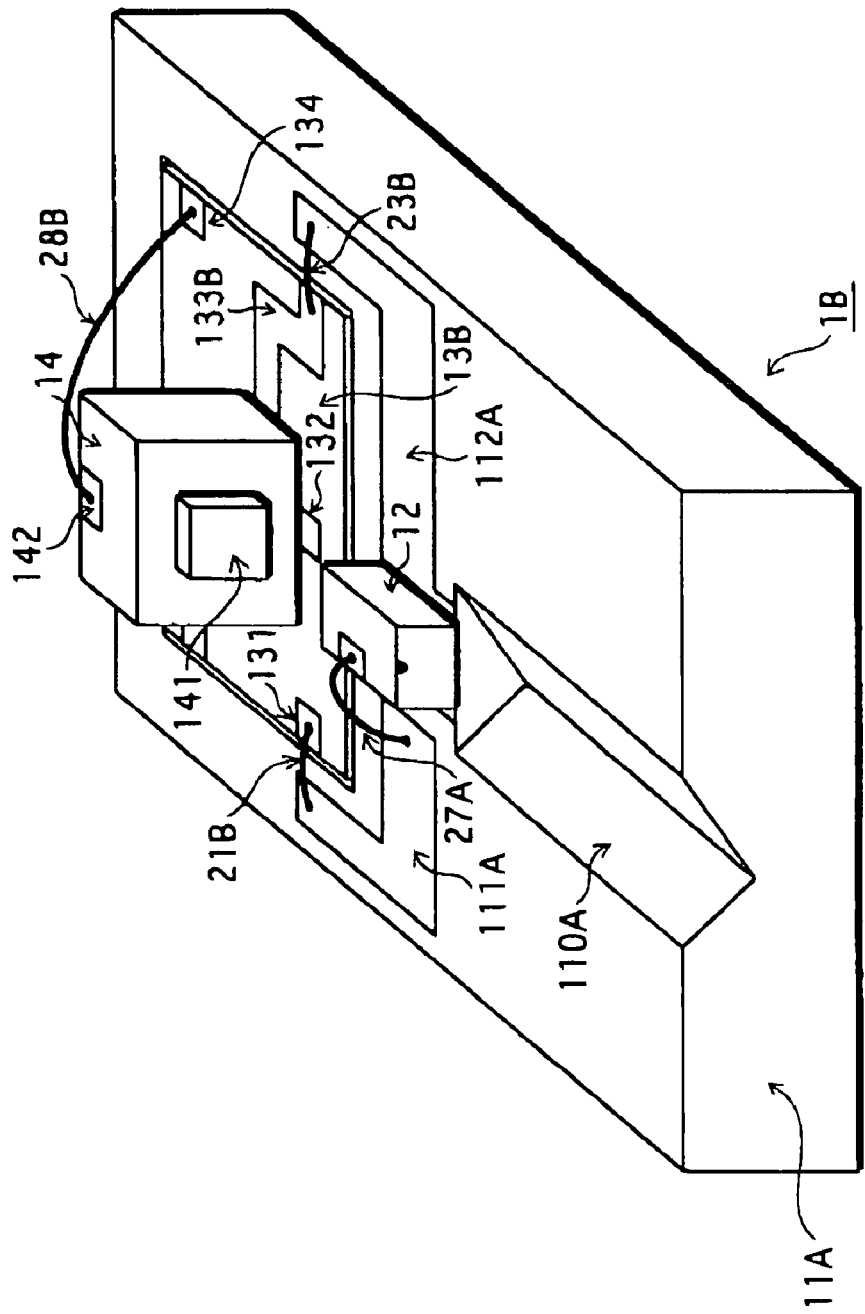
FIG. 10 is a perspective view of the optical transmission module of Modification 1.

FIG. 10 is a perspective view of the optical transmission module of Modification 1.

An optical transmission module 1B includes the substrate 11A, the light-emitting device 12, a driving device 13B, the monitoring light-receiving device 14, and wires 21B, 23R, 27A and 28B.

The optical transmission module 1B differs from the optical transmission module 1A in Embodiment 2 in that it does not use the sub-substrate 51, and that the monitoring light-receiving device 14 is disposed directly on top of the driving device 13B.

The substrate 11A eased in Embodiment 2 is also used in this modification.

The driving device 13B has the same function as the driving device 13 described in Embodiment 2, and includes terminals 131, 132, 133B, 134, 135, and 136.

The terminal 133B is a ground terminal, is connected with the wiring pattern 112A by the wire 23B, and is connected with the ground terminal of the monitoring light-receiving device 14 by soldering.

The terminal 134 is connected with the electrode 142 by the wire 24.

<Modification 2>

Figure 11:
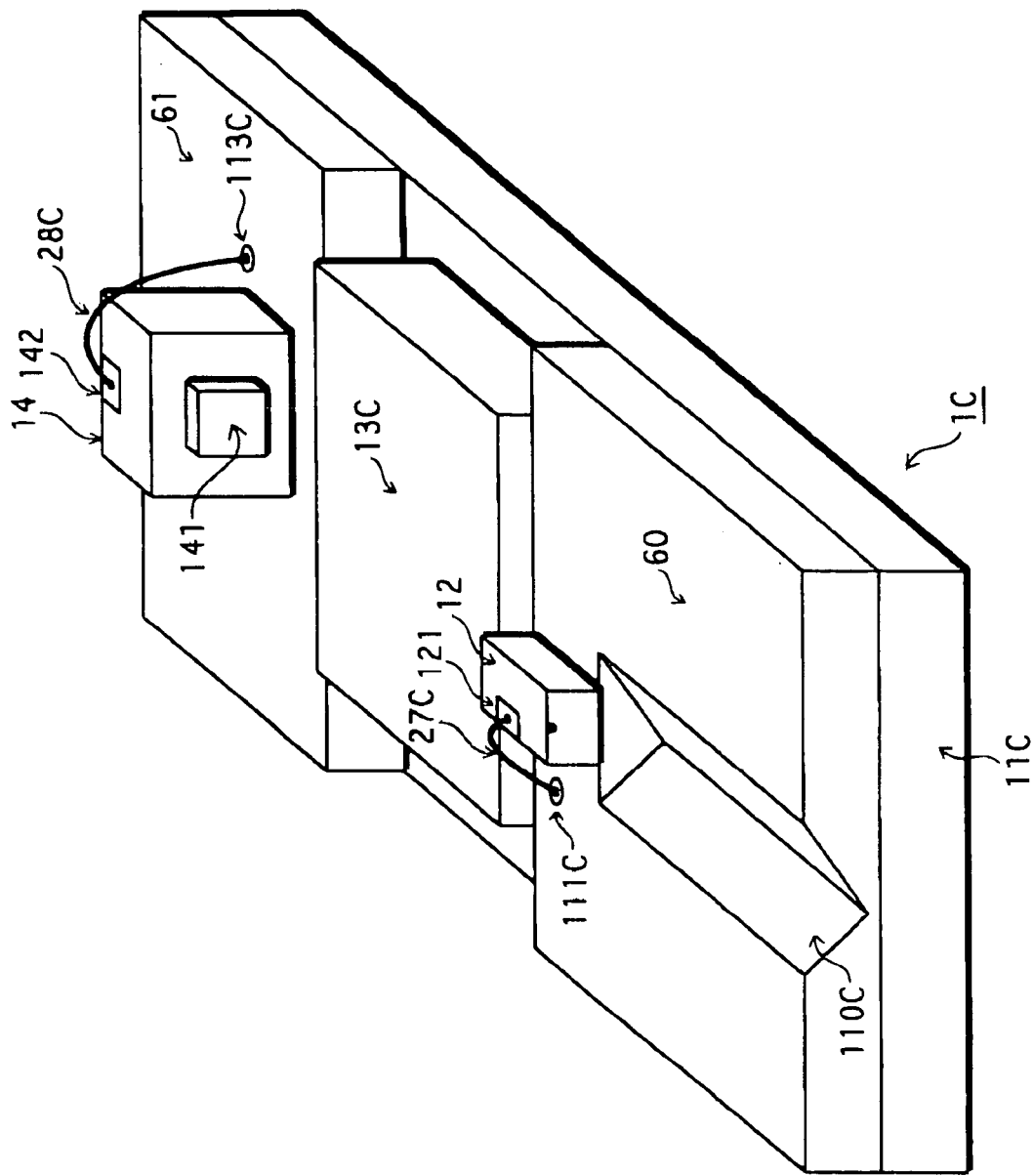
FIG. 11 is a perspective view of the optical transmission module of Modification 2.

FIG. 11 is a perspective view of the optical transmission module of Modification 2.

An optical transmission module 1C includes a substrate 11C, a base substrate 60, a base substrate 61, the light-emitting device 12, a driving device 13C, the monitoring light-receiving device 14, and wires 27C and 28C.

The optical transmission module 1C differs from the optical transmission modules of the embodiments and modifications in that it lacks the concave formed in the substrate, but the base substrates 60 and 61 are disposed to sandwich the driving device 13C in the direction along the optical axis, and the light-emitting device 12 and the monitoring light-receiving device 14 are formed on the base substrates 60 and 61, respectively.

The driving device 13C is a BGA-type chip with terminals formed on the back surface, where the BGA stands for Ball Grid Array. The driving device 13C is connected, by soldering, with a wiring pattern (not illustrated) formed on the main surface of the substrate 11C.

The base substrate 60 is a Si substrate, and on the main surface thereof, a V groove 110C, a via 111C, and a ground electrode (not illustrated) are formed.

The via 111C extends to the back surface of the base substrate 60, and is connected with a wiring pattern (not illustrated) formed on the main surface of the substrate 11C, the wiring pattern, in turn, being connected with a high-frequency current supply terminal of the driving device 13C.

The light-emitting device 12 is formed on the ground electrode (not illustrated), and they are connected with each other by soldering.

The base substrate 61 is a Si substrate, and on the main surface thereof, a via 113C and a power electrode (not illustrated) are formed.

The via 113C extends to the back surface of the base substrate 61, and is connected with a wiring pattern (not illustrated) formed on the main surface of the substrate 11C, the wiring pattern, in turn, being connected with an activation current input terminal of the driving device 13C.

<Modification 3>

Figure 12:
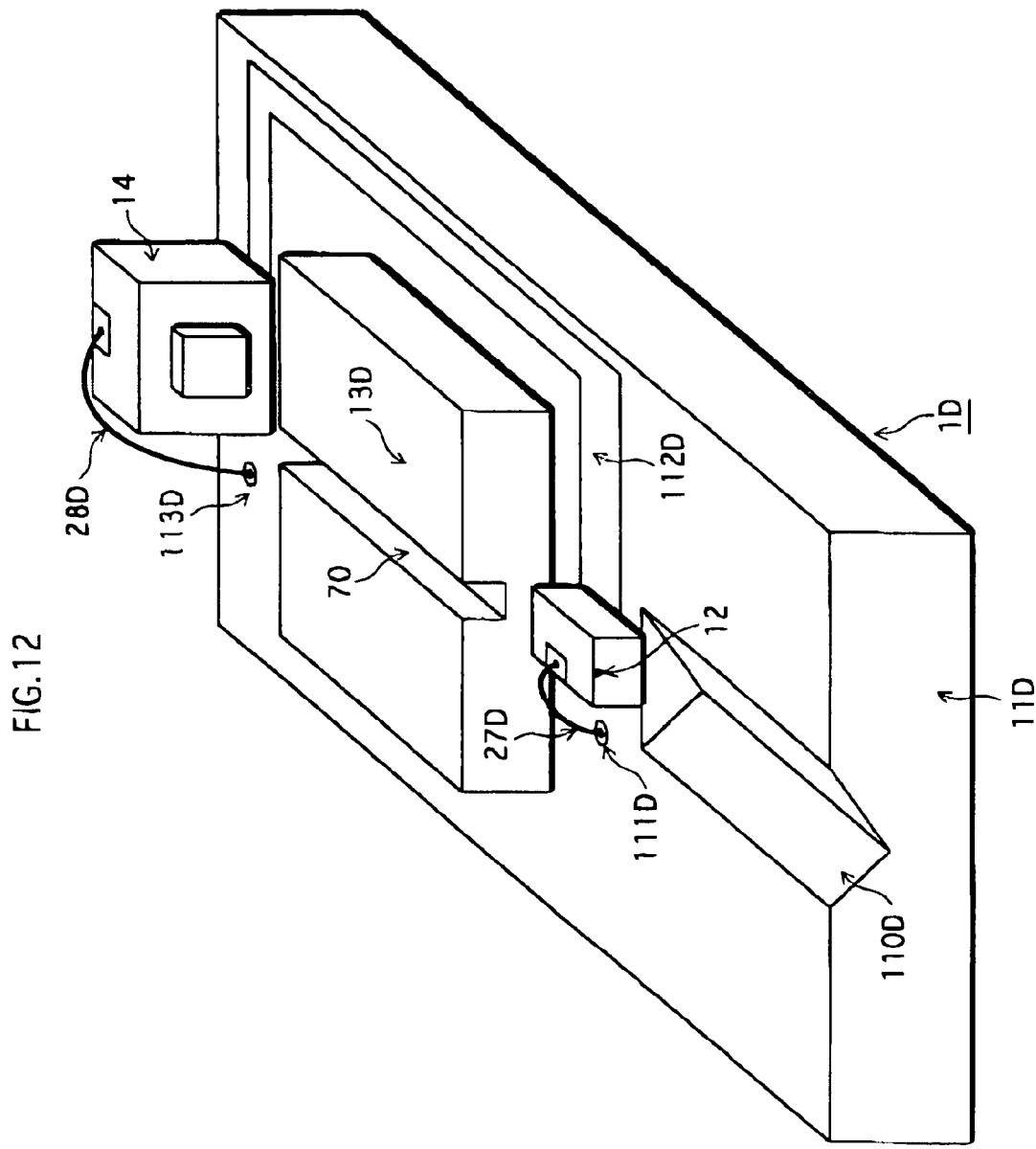
FIG. 12 is a perspective view of the optical transmission module of Modification 3.

FIG. 12 is a perspective view of the optical transmission module of Modification 3.

An optical transmission module 1D includes a substrate 11D, the light-emitting device 12, a driving device 13D, the monitoring light-receiving device 14, and wires 27D and 28D.

The optical transmission module 1D differs from the optical transmission modules of the embodiments and modifications in that it has a groove 70, in the upper part of the driving device 13D made of molded resin, to let the backward light emitted from the light-emitting device 12 pass through the space thereof.

The driving device 13D is a BGA-type chip with terminals formed on the back surface. The driving device 13D is connected, by soldering, with a wiring pattern (not illustrated) formed on the main surface of the substrate 11D.

The substrate 11D is a Si substrate, and on the main surface thereof, a via 111D, a ground wiring pattern 112D, a via 113D and the like are formed.

The light-emitting device 12 is connected with the via 111D by the wire 27D. The light-receiving device 14 is connected with the via 113D by the wire 28D. The ground wiring pattern 112D is connected with the ground electrodes of the light-emitting device 12 and the light-receiving device 14.

<Modification 4>

Figure 13:
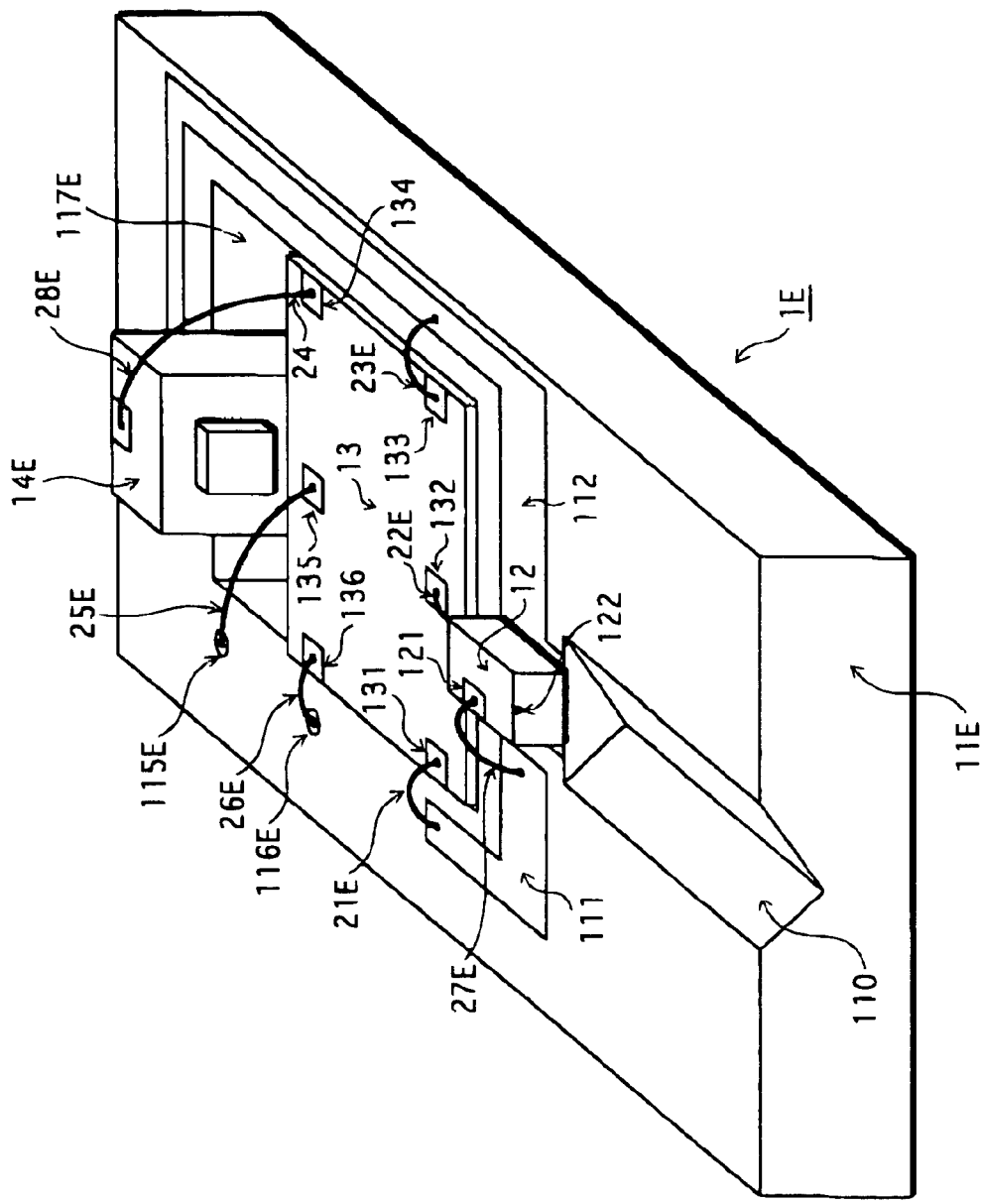
FIG. 13 is a perspective view of the optical transmission module of Modification 4.
Figure 14:
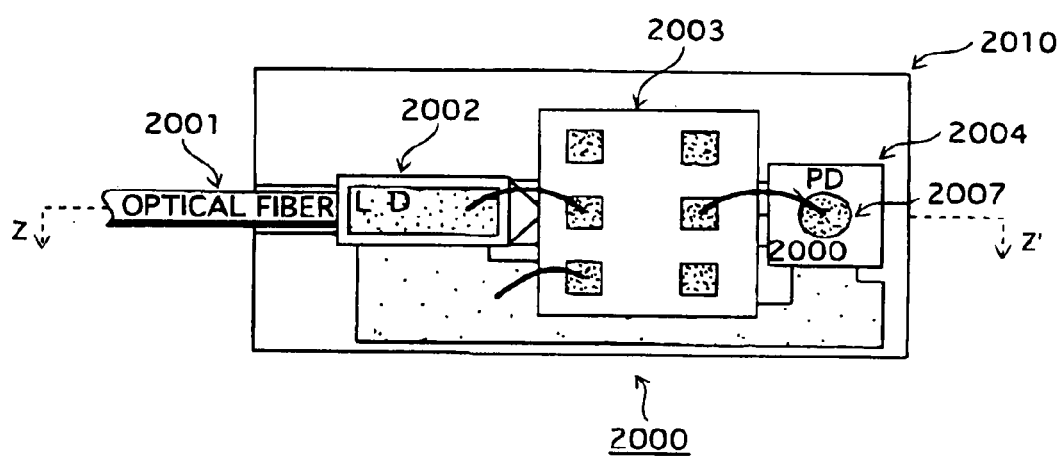
FIG. 14 is a plane view of the light-emitting apparatus disclosed in the patent document.
Figure 15:
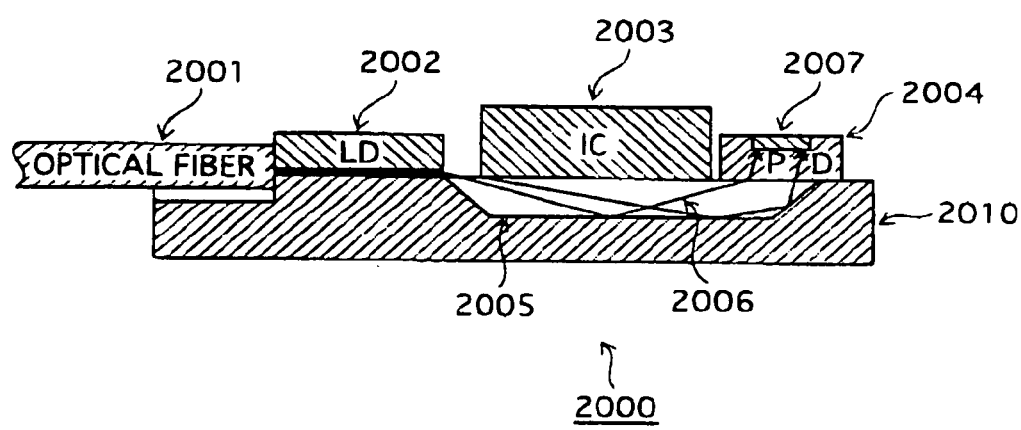
FIG. 15 is a cross section of the light-emitting apparatus disclosed in the patent document.

FIG. 13 is a perspective view of the optical transmission module of Modification 4.

An optical transmission module 1E includes a substrate 11E, the light-emitting device 12, the driving device 13, a monitoring light-receiving device 14E, and wires 21F–28E.

The substrate 11E is a Si substrate, and in which the V groove 110, wiring patterns 111 and 112, vias 114 (not illustrated), 115E, and 116E, and a concave 117E are formed.

The concave 117E is a rectangular concave formed to hold therein the driving device 13 and the monitoring light-receiving device 14E. The size of the concave 117E depends on the sizes of the driving device 13 and the monitoring light-receiving device 14E.

The optical transmission module 1E differs from the optical transmission modules of the embodiments and modifications in that the driving device 13 and the monitoring light-receiving device 14E are disposed in the concave 117E formed in the substrate 11E.

<Supplemental Notes>

(1) Microstrip lines or coplanar lines which have superior high-frequency property may be used as the wires for electrically connecting the devices in the optical transmission module of the present invention. Also, ribbon wires may be used as the wires for connecting the devices. Use of such lines contributes to the reduction of the parasitic inductance.

(2) The above-described method of arranging a device on a bottom of a concave formed in the substrate so as to reduce the vertical interval between an electrode formed on top of a device and a wiring pattern formed on the substrate may be applied to mounting, onto a circuit, a high-frequency module other than an optical transmission module.

(3) The substrate used in the optical transmission module of the present invention is not limited to a semiconductor substrate, but may be made of ceramic, metal or the like.

(4) The optical transmission module of the present invention may be produced by the active alignment method.

(5) The substrate used in the optical transmission module of the present invention may not have the V groove.

(6) In the above-described embodiments or modifications, the light-emitting device is mounted junction-up. However, the light-emitting device may be mounted junction-down. In the junction-down mounting, the light-emitting device is placed on a semiconductor substrate so that a front surface of the device, namely a surface on the side of a light-emitting layer (active layer) among a plurality of layers constituting a semiconductor laser, faces the semiconductor substrate, and the front surface is attached to the semiconductor substrate. In the junction-up mounting, the light-emitting device is placed on the semiconductor substrate the front surface side up, and the back surface (that is to say, a surface of the light-emitting device opposite to the front surface) is attached to the semiconductor substrate.

(7) In Embodiment 2, the sub-substrate 51 is wide enough to cover the entire concave 117. However, the sub-substrate 51 may just be wide enough to cover part of the concave 117.

(8) It is desirable that the height of the driving device disposed on the bottom of the concave formed in the substrate is approximately equal to the depth of the concave, but this is not an absolute necessity.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. An optical transmission module comprising:
   a light-emitting device;
   a light-receiving device operable to directly receive backward light emitted from the light-emitting device;
   a driving device operable to drive the light-emitting device; and
   a substrate on which the light-emitting device, the light-receiving device, and the driving device are arranged, wherein
   the light-receiving device is disposed directly on the substrate, and the driving device is entirely disposed between the light-emitting device and the light-receiving device so as to be lower than a straight line connecting a backward light emitting point of the light-emitting device and a backward light receiving point of the light-receiving device, said driving device not contacting said light-receiving device but electrically connecting with said light-receiving device,
   wherein a concave section is formed in a surface of the substrate between the light-emitting device and the light-receiving device, and the driving device is disposed on a bottom surface of the concave section.

2. The optical transmission module of claim 1, wherein
   a depth of the concave is approximately equal to a height of the driving device disposed on the bottom of the concave,
   a wiring pattern is formed on the substrate to electrically connect the light-emitting device with the light-receiving device, and
   the wiring pattern is connected with the driving device by a conducting wire.

3. The optical transmission module of claim 2, wherein the conducting wire is a ribbon wire.

4. The optical transmission module of claim 1, wherein
   a concave is formed on a surface of the substrate on a side of the backward light emitting point of the light-emitting device, and the driving device and the light-receiving device are disposed on a bottom of the concave.

5. The optical transmission module of claim 1, wherein
   a front convex is formed on a surface of the substrate in front of the driving device, a back convex is formed on a surface of the substrate in back of the driving device, the light-emitting device is disposed on top of the front convex, and the light-receiving device is disposed on top of the back convex.

6. The optical transmission module of claim 1, wherein
   a groove is formed in the driving device so as to let the backward light pass through a space thereof.

* * * * *